United States Patent [19]

Mori et al.

[11] Patent Number: 4,922,497
[45] Date of Patent: May 1, 1990

[54] OPTICAL LOGIC CIRCUIT

[75] Inventors: Yoshihiro Mori, Hirakata; Jun Shibata, Kawachinagano, both of Japan

[73] Assignee: Matsushita Electric Industrial Co., Ltd., Osaka, Japan

[21] Appl. No.: 309,919

[22] Filed: Feb. 7, 1989

Related U.S. Application Data

[63] Continuation-in-part of Ser. No. 94,404, Sep. 8, 1987, abandoned.

[30] Foreign Application Priority Data

Sep. 8, 1986 [JP] Japan ............................. 61-210928

[51] Int. Cl.$^5$ .............................................. H01S 3/30
[52] U.S. Cl. ......................................... 372/8; 372/27; 372/50
[58] Field of Search ................ 372/8, 26, 27, 50, 106, 372/38, 43

[56] References Cited

U.S. PATENT DOCUMENTS 3,301,625 1/1967 Ashkin et al. .......................... 372/50

FOREIGN PATENT DOCUMENTS 0198887 10/1985 Japan .................................. 372/106

OTHER PUBLICATIONS

IEEE Journal of Quantum Electronics, QE-vol. 21, p. 298, "Digital Optical Signal Processing with Polarization-Bistable Semiconductor Lasers".
"Proceedings of the 32nd Meeting of Applied Physics Joint Conference", p. 140, 31a-ZB-7 to 8.
IEEE Journal of Quantum Electronics, QE-No. 19, p. 1621, "Optoelectronic Logic Operations by Cleaved-Coupled-Cavity Semiconductor Lasers".
"Bistability in Coupled Cavity Semiconductor Lasers", Applied Physics Lett., Dutta, N. K., Jan. 1984, pp. 30–32.
"Optical Input and Output Characteristics for Bistable Semiconductor Lasers", Applied Physics Letters, vol. 41, pp. 702–704.
"High-Speed Modulation of Semiconductor Lasers", Rodney S. Tucker, Senior Member, IEEE; IEEE Transactions on Electron Devices, vol. ED-32, No. 12, Dec. 1985.
"Influence of Waveguide Design on Threshold Current of InGaAsP-InP Metal-Clad Ridge-Waveguide Lasers", Markus-Christian Amann and Bernhard Stegmuller; Tenth IEEE International Semiconductor Laser Conference, Oct. 14–17, 1986.
"Narrow-Stripe Metal-Clad Ridge-Waveguide Laser for 1.3 m Wavelength", Markus-Christian Amann and Bernhard Stegmuller, Appl. Phys. Lett. 48 (16), 21 Apr. 1986.
Extended Abstracts of the 18th (1986 International) Conference on Solid State Devices and Materials, Tokyo, 1986, pp. 723–724.

*Primary Examiner*—William L. Sikes
*Assistant Examiner*—B. R. R. Holloway
*Attorney, Agent, or Firm*—Wenderoth, Lind & Ponack

[57] ABSTRACT

An optical logic circuit which is high in operation speed, low in power dissipation, and capable of operating at room temperature, possesses a semiconductor laser biased at a constant current higher than a threshold current. A light input is injected into the laser, the light input differing in the polarization direction of its oscillation mode. The output light of the semiconductor laser has a bistability characteristic with respect to the light input.

11 Claims, 13 Drawing Sheets

Time (50nsec/unit)

Light Output $P_1$

OPTICAL LOGIC CIRCUIT

This application is a continuation-in-part of now abandoned application Ser. No. 07/094,404, filed Sept. 8, 1987.

BACKGROUND OF THE INVENTION

This invention relates to an optical logic circuit using a semiconductor laser.

A logic circuit using light as a signal (an optical logic circuit) is considered to have such features that the propagation velocity of light is faster than an electrical signal, and the logic circuit is directly coupled to an optical fiber communication system. In particular, when an optical logic circuit is integrated on a semiconductor substrate, there occur advantages such that the entire dimensions of the circuit are reduced, its reliability is enhanced, and so on. Because of such advantages, intensive research is being concentrated on an optical logic circuit using a semiconductor laser or a semiconductor photodetector.

The following examples, among others, are known: the flip-flop of a light input and a light output using a polarization bistable laser and optoelectronic switch (for example, IEEE Journal of Quantum Electronics, QE-vol. 21, page 298), the optical switch for switching the light output of a tandem type bistable laser from a lower state to higher state by means of an external light input (for example, Proceedings of the 32nd Meeting of Applied Physics Joint Conference, page 140, 31a-ZB-7 to 8), and the logic gate of an electrical input light output using a cleaved coupled cavity laser (for example, IEEE Journal of Quantum Electronics, QE-No. 19, page 1621).

In these methods, however, since an electric current occurs in the signal line, the operation speed is determined by an electrical time constant. To obtain an expected high speed operation by avoiding this, it is necessary to arrange it so that the signal may be entirely processed by light while the current or voltage only supplies bias to the device. Accordingly, a so-called optical bistable device having a hysteresis in the light-output versus light-input characteristic is needed. More particularly, it is preferable for the circuit construction to amplify, more or less, the incident light, which gives rise to the necessity of the development of an optical bistable device using a semiconductor laser which is an active device. An example of an optical logic circuit using a semiconductor laser is described below.

Figure 11:
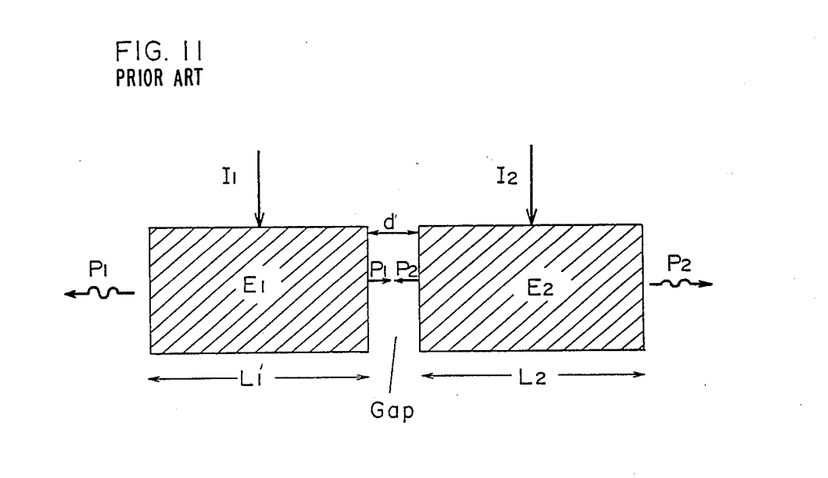
FIG. 11 is a block diagram showing the structure of an optical logic circuit in a first conventional example.
Figure 12:
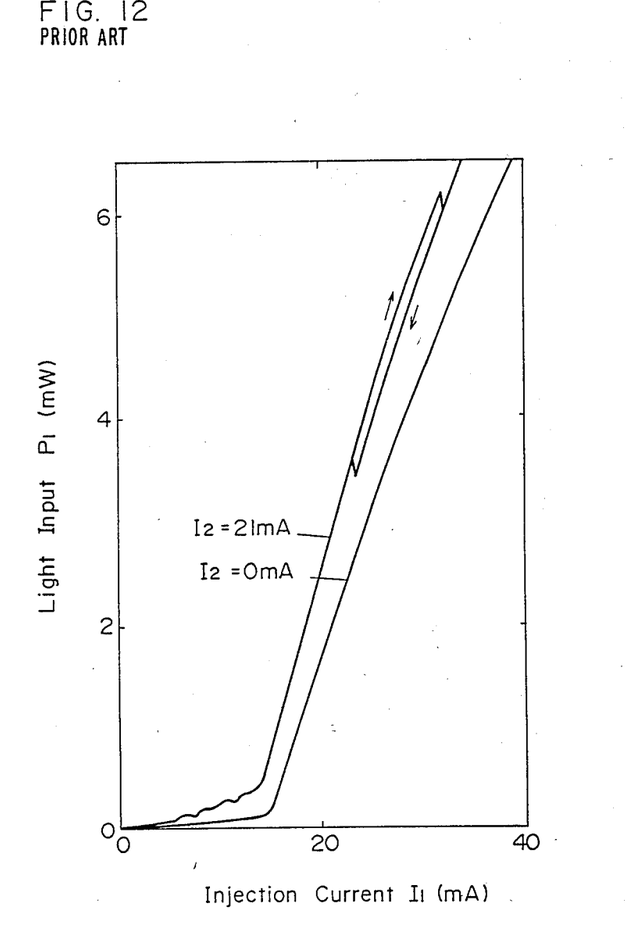
FIGS. 12, 13, and 14 show the operation characteristics of the first conventional example.
Figure 13:
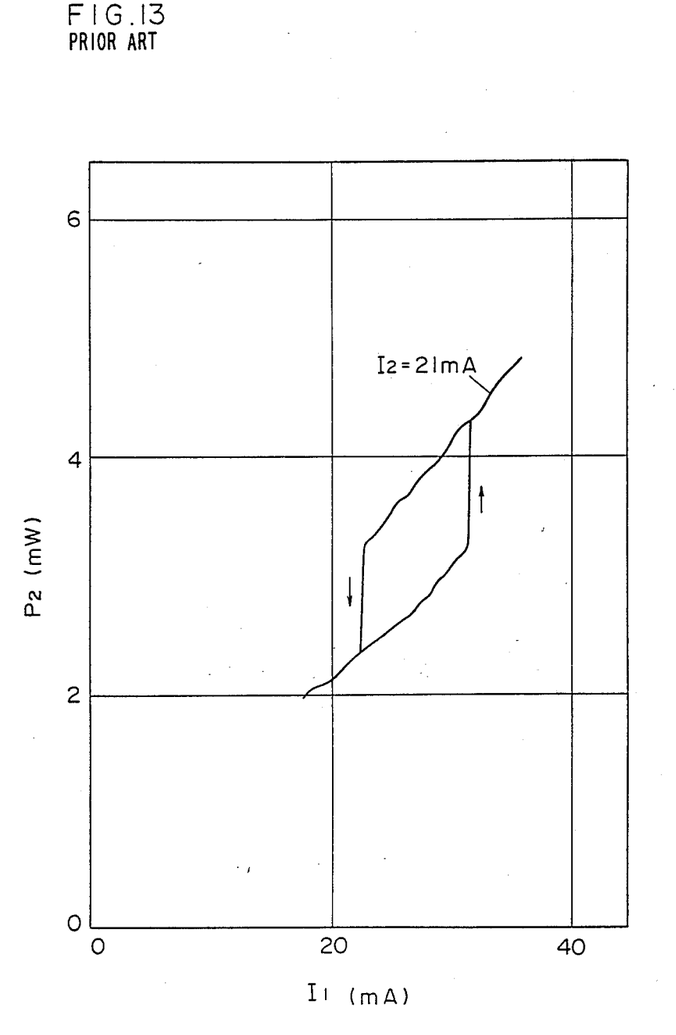

FIG. 11 shows the structure of an example of a conventional optical logic circuit (for example, the one disclosed in the Journal of Applied Physics, No. 56, page 664). This is to make use of a cleaved coupled cavity laser. The cavity lengths $L_1$ and $L_2$ of two semiconductor lasers $E_1$ and $E_2$ are 250 microns, and the gap d is 5 microns or less, and the active layers of $E_1$ and $E_2$ confront each other. The basic structure of $E_1$ and $E_2$ is same as that of a buried crescent laser. $E_1$ denotes an ordinary laser characteristic of a threshold value of 15 milliamperes as indicated by the curve of $I_2=0$ milliampere in FIG. 12. $E_2$ has a similar characteristic. In this setting, when the current $I_2$ flowing into $E_2$ is fixed at 21 milliamperes and the current $I_1$ flowing into $E_1$ is varied, the light outputs $P_1$ and $P_2$ of $E_1$ and $E_2$ respectively change as shown in FIGS. 12 and 13. At this time, a hysteresis is observed among $P_1$, $P_2$, and $I_1$ in a region where $I_1$ is between 23 milliamperes and 32 milliamperes. This phenomenon is considered to be derived from the fact that saturation of the gain has occurred as the laser light from $E_1$ and $E_2$ are mutually injected into the other sides. For this reason, the hysteresis has occurred in a region of high light output in which the injection current $I_1$ is about twice as high as the threshold current. It is characteristic, at the same time, that a hysteresis has also occurred in $P_2$ although $I_2$ is constant because the both are strongly bonded optically. The relationship between $P_1$ and $P_2$ is expressed by an optical bistability as shown in FIG. 14.

Figure 15:
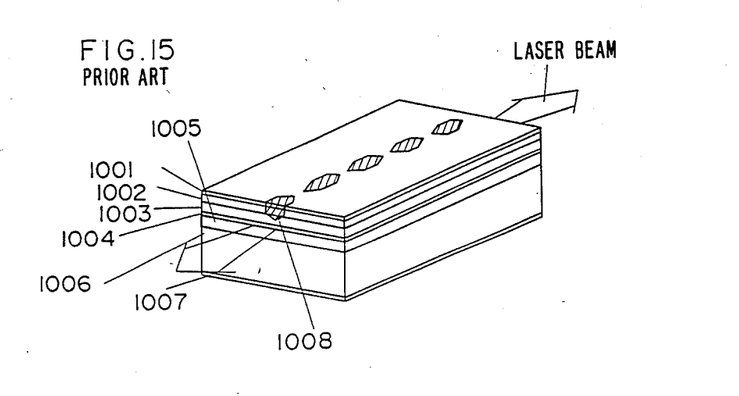
FIG. 15 is a perspective view of an optical logic circuit in a second conventional example.
Figure 16:
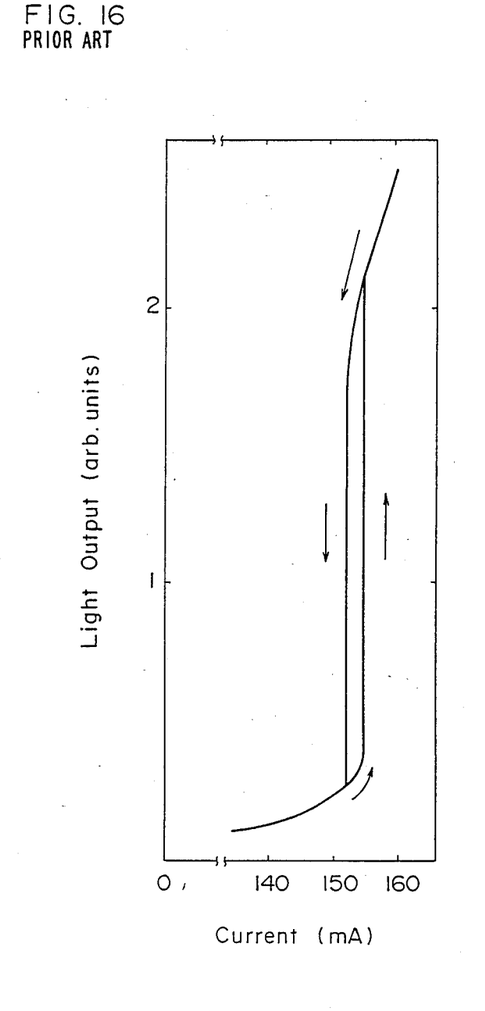
FIG. 16 shows a light-input versus current characteristic of the second conventional example.

FIG. 15 shows another example of a conventional optical logic circuit device (for example, the one disclosed in the Applied Physics Letters, vol. 41, page 702). In this structure, an ordinary slab type semiconductor laser's P-type electrode is processed into a window type electrode measuring 10 microns in width, 20 microns in length, and 30 microns in pitch. When this element is cooled to 212.1 degrees kelvin and a current is passed therethrough, the light intensity delivered from an active layer 1004 is as shown in FIG. 16. A hysteresis is observed in the vicinity of a current of 153 milliamperes. This is because the p-type electrode is transformed into a window type electrode, so that a non-current injection region is present in an active layer, which functions as a saturable absorber. This device having a bistable property by itself can cause a bistable action also by injecting light from outside. That is, by fixing the current flowing in the device at 152.6 milliamperes, when light is injected by using a buried heterostructure semiconductor laser, an optical bistability is obtained as shown in FIG. 17.

Figure 14:
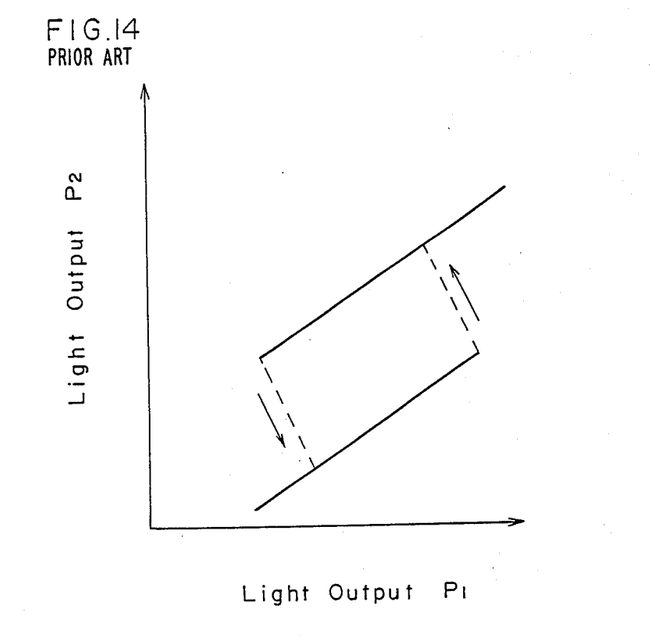
Figure 17:
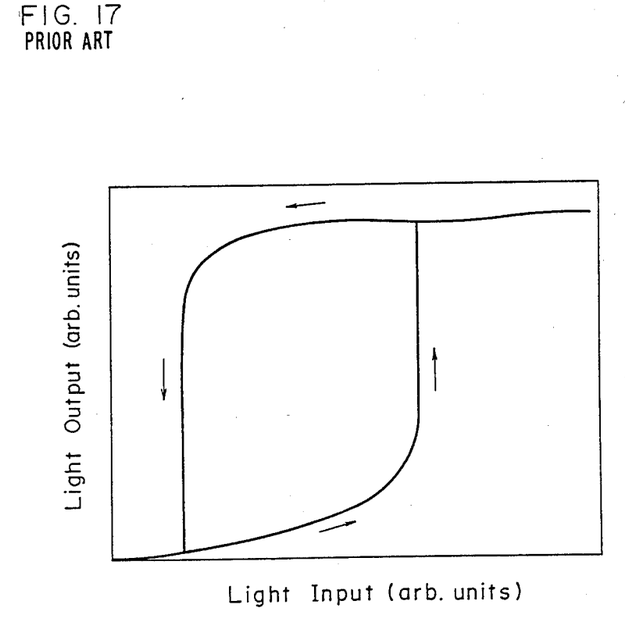
FIG. 17 shows an optical bistability characteristic of the second conventional example.

However, in the case of the prior art shown in FIG. 17, although the optical bistability as shown in FIG. 14 may be obtained, light outputs $P_1$ and $P_2$ of $E_1$ and $E_2$ affect each other, and it is hard to construct such a structure as so to control $P_2$ by $P_1$. Besides, because of the utilization of the saturation of the gain of the semiconductor laser, it is necessary to inject a high current, and it is hard to lower the power consumption.

On the other hand, in the case of the prior art shown in FIG. 15, it is necessary to made a saturable absorber within an active layer, it is necessary to operate at a low temperature while elevating the threshold current, which results in slow switching speed, among other problems.

SUMMARY OF THE INVENTION

It is hence a primary object of this invention to present an optical logic circuit having features such as a low dissipation current and a high switching speed, and capable of operating at room temperature, and using laser light as an input and output light.

To achieve the above and other objects, the optical logic circuit of this invention comprises at least a semiconductor laser which oscillates in a first polarization biased at a constant current higher than a threshold current, a light source disposed so as to inject an optical signal into the semiconductor laser, and a means for selectively passing only the component in a second polarization out of the optical signals from the light source being disposed between the semiconductor laser and light source, whereby, as a result of change in the quantity of light of the optical signal, a competition of the gain in the first polarization and the gain in the second polarization and a resultant change in the carrier concentration occur in the semiconductor laser, and the output light of the semiconductor laser is changed over between the first polarization and second polarization at a high speed of about 100 picoseconds, and this changeover presents a bistability, that is, a bistability of optical polarization occurs.

While the novel features of the invention are set forth in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
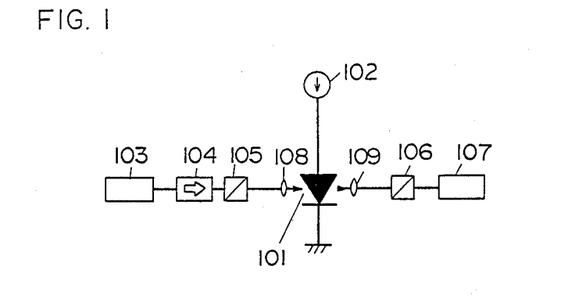
FIG. 1 is a block diagram showing structure of an optical logic circuit in one of the embodiments of this invention.
Figure 7:
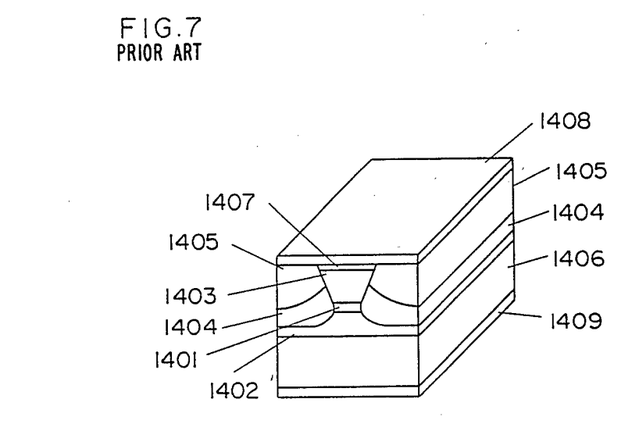
FIG. 7 is a perspective view of a semiconductor laser used in an optical logic circuit in a different embodiment of this invention.

FIG. 1 shows a structure of one of the embodiments of an optical logic circuit of this invention. A semiconductor laser 101 is a buried heterostructure laser having an active layer of indium-gallium-arsenic-phosphorus (InGaAsP) emitting a laser light with the center wavelength of 1.3 microns whereby the front and rear planes of this device constitute a laser optical resonator. FIG. 7 shows one example of lasers to which this invention is applicable. The laser shown in FIG. 7 is known to the public. Element 1401 is an active layer made of InGaAsP which emits laser light of 1.3 micron. Elements 1402, 1403, 1404, 1405 are an n type InP layer, a p type InP layer, a p type InP layer, an n type InP layer as a clad layer, respectively. Since the refractive index of these clad layers is smaller than that of active layer 1401, laser light is confined in the active layer 1401. These layers are formed on an n type InP substrate 1406. Element 1407 is a cap layer made of a p type InGaAsP which is used for lowering contact resistance with a p type electrode 1408. Generally, an alloy of Au and Zn is used as the p type electrode 1408. Element 1409 is an n type electrode which is generally made of an alloy of Au and Sn. Since the light propagates as being enclosed in the active layer having the highest refractive index, this type of laser is called an indexguiding type. From a current source 102, a constant current of 14.4 mA is injected into the semiconductor laser 101. This current corresponds to 1.05 times the threshold current at 24° C. of the semiconductor laser 101, therefore, a laser light is derived to output. A light source 103 is composed of a semiconductor laser similar to the semiconductor laser 101, and a lens for converting the output light therefrom into a collimated light. An optical isolator 104 passes the light from the light source 103, but does not pass the light from the semiconductor laser 101. The isolation ratio is 30 dB or more. This is composed of combination of yttrium-irongarnet crystal and two polarizers. The light source 103 also operates in a transverse electric mode (TE mode), and the output light possesses only a transverse electric component (TE component), but since the light from the light source 103 rotates about 45° in the polarization plane when passing through the optical isolator 104, so that only a transverse magnetic component (TM component) for the semiconductor laser 101 thereof is picked up by using a polarizer (Gran-Thompson prism) 105 and is focused by using a lens 108, and injected into an active layer of the semiconductor laser 101. At this time, when light is injected from the facet of the active layer, it is preferable because the loss of the quantity of incident light is small. Here, incidentally, the electric field vectors of the TE component and TM component are orthogonal to each other. Similarly, both magnetic field vectors are orthogonal to each other. However, instead of the constitution shown in FIG. 1, when the devices are coupled together by means of a waveguide, orthogonality of the electric field vectors and that of magnetic field vectors may not be satisfied at the same time.

On the other hand, the output light from the semiconductor laser 101 is converted into a collimated light by a lens 109, and the component having a specific polarization is selectively received by a photodetector 107 by means of a polarizer (Gran-Thompson prism) 106. The photodetector 107 is composed of a lens for focusing the collimated light, an avalanche photodiode (APD), and an optical fiber for guiding the focused light into the APD.

Figure 2A:
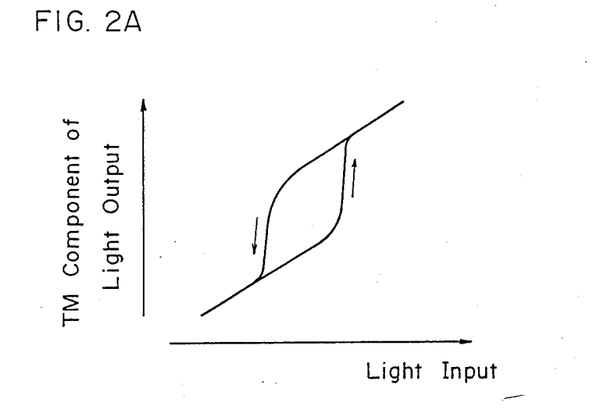
FIGS. 2A and 2B show characteristics to show the relationship between the light input and light output of the optical logic circuit.
Figure 2B:
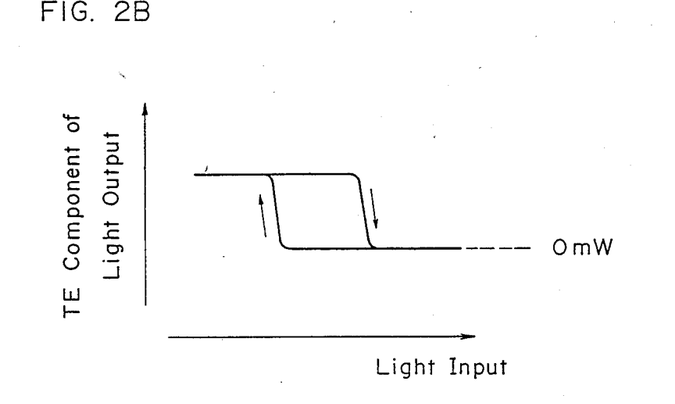
Figure 3A:
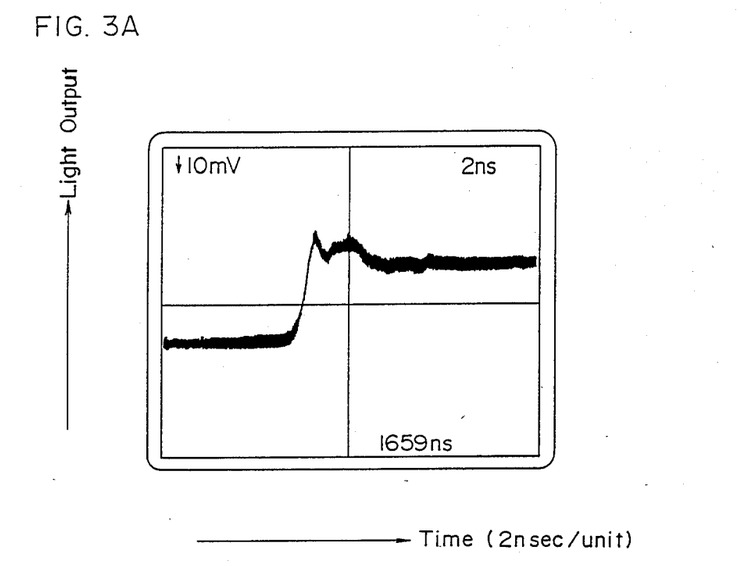
FIGS. 3A and 3B show switching characteristics observed on an oscilloscope of the light output of the optical logic circuit.
Figure 3B:
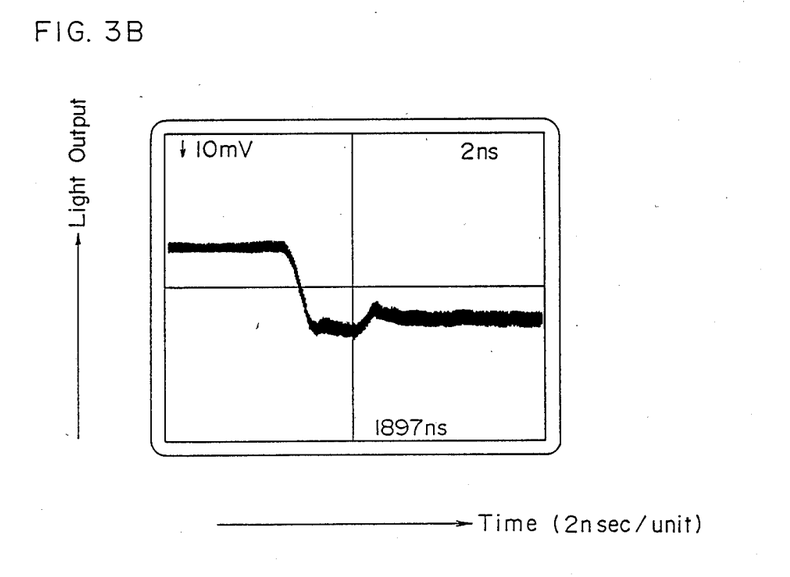
Figure 4:
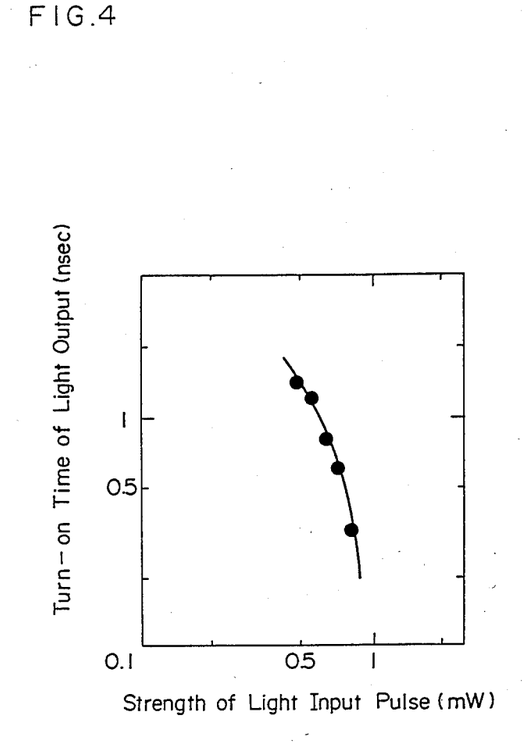
FIG. 4 shows a characteristic showing the relationship between turn-on time of the light output and pulse height of the light input in the optical logic circuit.
Figure 5:
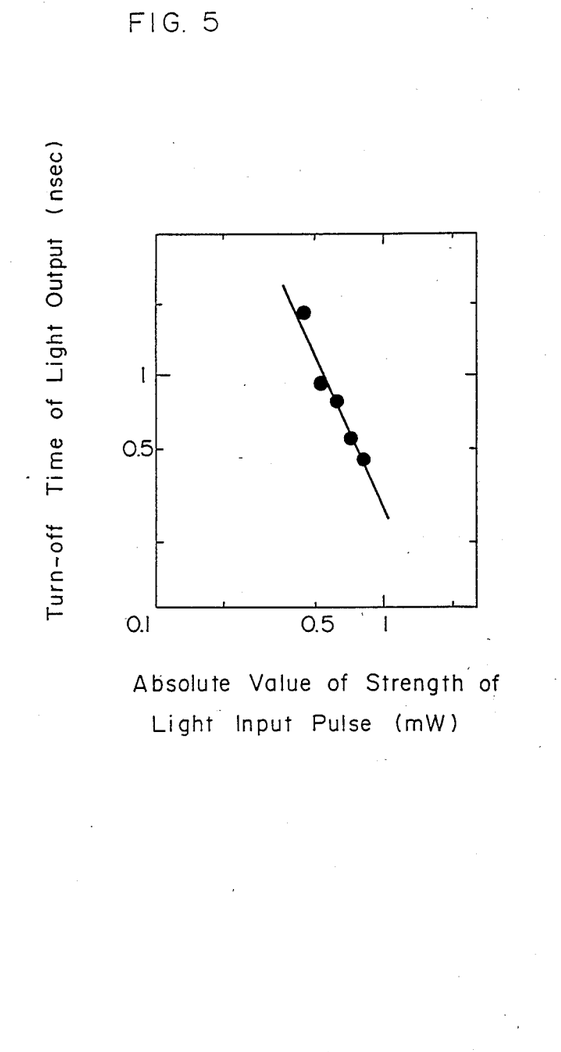
FIG. 5 shows a characteristic showing the relationship between turn-off time of the light output and pulse height of the light input in the same optical logic circuit.
Figure 6:
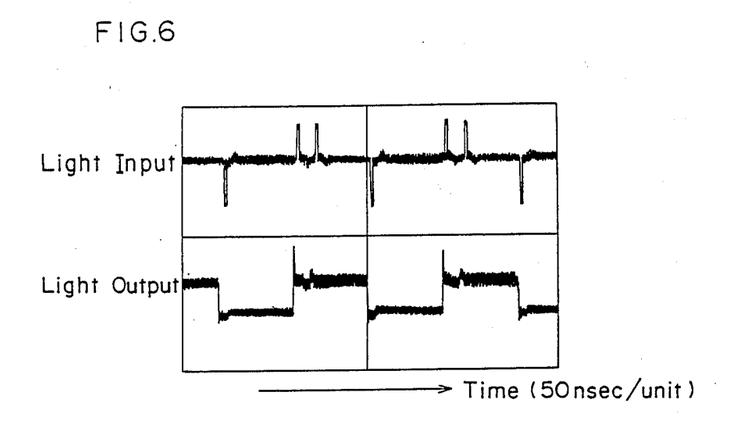
FIG. 6 shows a characteristic showing an RS flip-flop operation of the same optical logic circuit observed on an oscilloscope.

In such an optical system as described above, when the intensity of the output light from the light source 103 is varied, as shown in FIG. 2A, a hysteresis is obtained between the TM component intensisites of the light output and the light input of the semiconductor laser 101. The diagram shows when only the TM component is designed to reach the photodetector 107 by means of the polarizer (Gran-Thompson prism) 106. When only the TE component is received by the photodetector 107, the hysteresis becomes as shown in FIG. 2B. As is clear from these two diagrams, in this stability, hysteresis between the TM component of the output light and the quantity of input light and hysteresis between the TE component of the output light and the quantity of input light can be observed, separately. This is because the non-oscillation mode is suppressed by the oscillation mode. Therefore, clearly, these two hysteresis effects are complimentary. Thus, since the switching of the TE mode and TM mode does not seem to undergo such carrier concentration changes as experienced in the prior art, the switching speed is expected to be enhanced. Actually, as shown in FIG. 3, both the rise time (FIG. 3A) and the fall time (FIG. 3B) are less than 1 nsec. FIG. 4 is a graph showing the dependence of the time required to rise (turn-on time) on the pulse height of the light input. When the pulse height was 0.84 mW, the turn-on time was 340 psec. FIG. 5 is a graph showing the dependence of the time required to fall (turn-off time) of the pulse height of light input. Similarly, when the pulse height was 0.84 mW, the turn-off time was 430 psec. However, when measuring the characteristics in FIGS. 4 and 5, the light input pulse was superposed on the constant light input with an intensity of 1.0 mW. When a positive pulse is superposed, the light output rises, and when a negative pulse is superposed, the light output falls. By making use of such a characteristic, as shown in FIG. 6, the light output shows an RS flip-flop characteristic with respect to the light input. That is, when a positive pulse is superposed, the light output changes from lower state to higher state, and thereafter a higher state is maintained until a negative pulse is superposed. Then, a lower state is maintained until a positive pulse is superposed again. In other words, when the positive and negative pulses are respectively assumed to be a set pulse and a reset pulse, and the higher state and lower state are considered to correspond to 1 and 0 in a digital circuit, the operation is same as that of an RS flip-flop as mentioned above. Incidentally, as stated above, since the TE and TM components of output light are complimentary, the TE component produces a reversed waveform which is opposite to the waveform of the TM component. In this manner, in the above-explained embodiment, a height speed optical flip-flop which can produce two outputs consisting of an ordinary and a reversed output are readily obtained.

Furthermore, light source 103 produces more than approximately 1 mW. On the other hand, since the semiconductor laser 101 is biased at 1.05 times the threshold level, it outputs approximately 100 $\mu$W. That is, since there are intensity differences of more than 10 times between these light outputs, even if two polarizers are removed to thereby nullify the isolation function and to only rotate the polarization plane of yttrium-iron-garnet, it is possible to neglect the operation error of light source 103 due to light injection from the semiconductor laser 101 to light source 103.

The slanted angle of the light source 103 to the semiconductor laser with regard to an axis connecting the light source 103 and the semiconductor laser 101 is not specifically defined. After the polarization plane is rotated 45° by optical isolator 104, if input or injected light has a TM component with respect to the semiconductor laser 101, it is enough. Based upon this thought, if the optical isolator 104 is removed and the light source 103 is in advance slanted towards the semiconductor laser 101, it is clear that similar characteristics are obtained.

Figure 8:
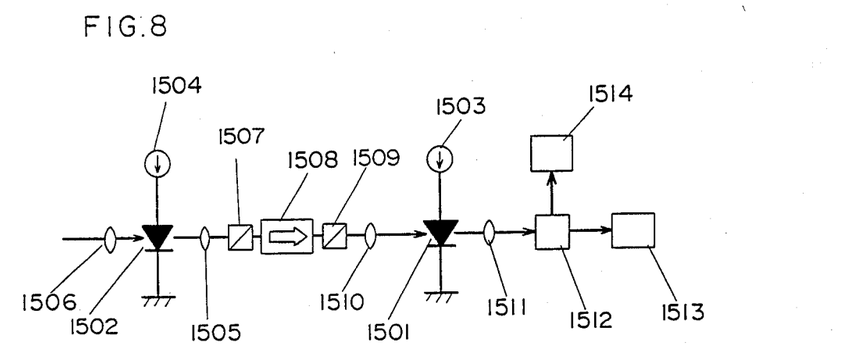
FIG. 8 is a block diagram showing the structure of an optical logic circuit in another embodiment of this invention.

FIG. 8 shows the structure of another embodiment of an optical logic circuit of this invention. Semiconductors 1501 and 1502 are ridge type semiconductor lasers having an active layer of indium-gallium-arsenic-phosphorus (InGaAsP) emitting a laser light with the center wavelength of 1.3 microns whereby the front and rear planes of this device constitute a laser optical resonator.

Figure 10:
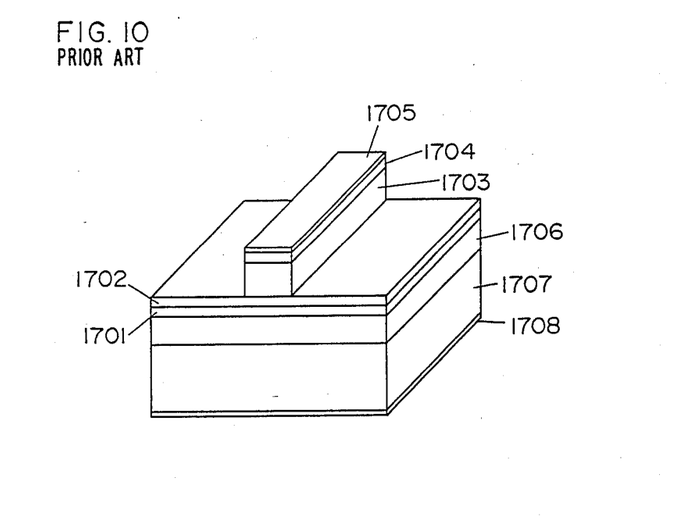
FIG. 10 is a perspective view of a semiconductor laser used in the optical logic circuit.

FIG. 10 shows one example of lasers to which this invention is applicable. The laser shown in FIG. 10 is known to the public. Elements 1701, 1702 are an active layer and waveguide of InGaAsP, respectively, and laser light is emitted from a portion of the active layer 1701 located right below the p type InP clad layer. Element 1704 is an InGaAsP cap layer for lowering the contact resistance with an alloy 1705 of Au and Zn. Elements 1706, 1707 are an n type InP clad layer and an n type InP substrate, respectively. Element 1708 is an alloy of Au and Sn which forms an ohmic contact with the n type InP substrate 1707. Current sources 1503 and 1504 are stationarily supplying a current slightly larger than the threshold currents of semiconductor lasers 1501 and 1502, so that the semiconductors 1501 and 1502 operate in a TE mode.

Figure 9:
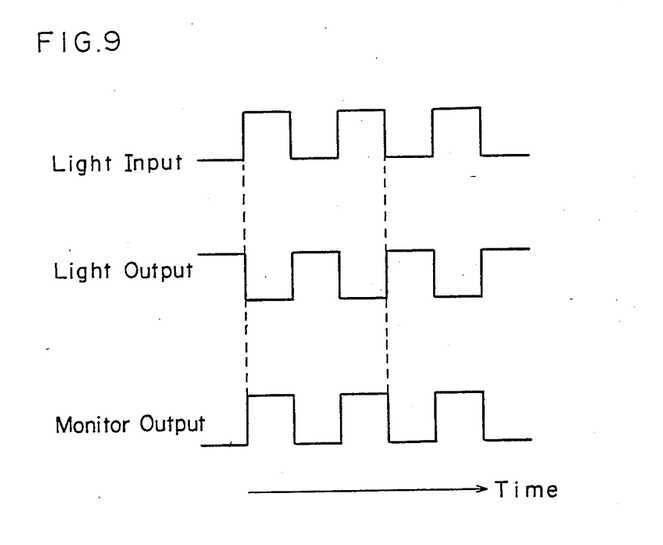
FIG. 9 shows a characteristic of the same optical logic circuit.

The semiconductor laser 1502, current source 1504, lenses 1505 and 1506 make up a light source, and this light source operates as an RS flip-flop as shown in FIG. 6 by means of a signal light coming from the left in the diagram. Of the light output from the light source, only the TM component for the semiconductor laser 1501 is passed through a polarizer (Gran-Thompson prism) 1507. This passed light passes through an optical isolator 1508, and enters another polarizer (Gran-Thompson prism) 1509, and of this light, the TM component for the 1501 is selectively passed, and focused through a lens 1510 to be injected into the 1501. As a result, the semiconductor laser 1501 presents a switching characteristic such as shown in FIG. 2. By transforming the output light into collimated light through a lens 1511 and passing only the TE component straight through by means of a polarization beam splitter 1512, the TM component is deflected in the vertical direction. When this TE component is received by a photodetector 1513, the light output is inverted as shown in the middle trace of FIG. 9, with respect to the waveform of light input of the upper trace. That is, the semiconductor laser 1501 functions as an inverter. Incidentally, the TM component separated by the 1512 can be used as a monitor of the light output because an inverted waveform of the light output waveform appears. This monitor light output is received by a light receiver 1514. The monitor waveform is as shown in the lower trace of FIG. 9.

Figure 18:
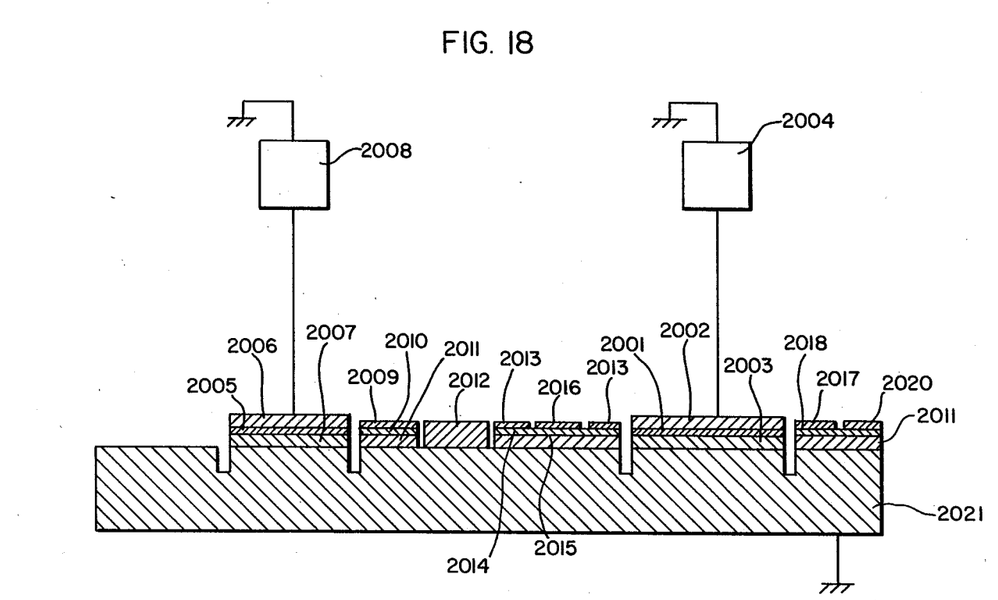
FIG. 18 is a sectional view of another embodiment of the present invention.

FIG. 18 is a sectional view of another embodiment of the invention. Designations 2001, 2002, 2003 respectively denote an InGaAsP active layer, a P-type InP clad layer, and an N-type InP clad layer. A semiconductor laser is formed by these layers. Designation 2004 denotes a current source which supplies a current which is 1.05 times the threshold level to the semiconductor laser. Designations 2005, 2006, 2007 respectively denote an InGaAsP active layer, a P-type InP clad layer, and an N-type InP clad layer. A semiconductor laser as a light source is formed by these layers. This light source is directly modulated by the power source 2008. Light outputted from the light source is transferred through a waveguide which comprises $SiO_2$ films 2009, 2001 and $Si_3N_4$ film 2010 and is inputted into a yttrium-iron-garnet crystal 2012. Designation 2012 has Faraday effect due to a magnet (not shown) and the polarization plane of the light is rotated by 45°. Thereafter, the light is inputted into a polarizer of the waveguide type which comprises SiO$_2$ films 2013, 2015, Si$_3$N$_4$ film 2014 and gold 2016. In this case, only the TM component selectively passes and is inputted into the semiconductor laser. The outputted light of the semiconductor laser is inputted into a detector which comprises SiO$_2$ films 2017, 2019, Si$_3$N$_4$ film 2018 and gold 2020 and the polarization plane is selected. These elements are disposed on an N-type InP substrate 2021.

Its operation is as follows. Output light of the semiconductor laser is modulated by power supply 2008 and this light is injected into active layer 2001 of the semiconductor laser. The light input waveform of the semiconductor laser on that occasion and the light output waveform thereof become the same as in FIG. 6. Incidentally, in this embodiment, the light input is injected into the semiconductor laser after the polarization plane is rotated using the yttrium-iron-garnet crystal 2012, but the following structures can be used to obtain the same advantages. That is (i) to make the polarization planes of the output light of the semiconductor lasers different from each other by changing configuration of active layer etc., or (ii) to make the polarization plane of the input different from that of the light output by forming at surface previously formed on substrate 2021.

In this embodiment, meanwhile, an optical logic circuit was composed on a single semiconductor laser, but the same effects will be obtained by forming an etched facet on the semiconductor laser by a dry process, and integrating other parts on the same substrate. Or, instead of the InGaAsP device used as the semiconductor laser in this embodiment, a AlGaAs, AlGaInP or other device may be used. As the polarizer, moreover, a waveguide having a metal in a cladding layer may be used. The semiconductor layer used in this embodiment operates in the TE mode, but the efficiency of this invention is not sacrificed at all by using a device which operates in another mode. Or, in this embodiment, light having only the TM component was used as light input, but it is the same when light composed of other components is used as the light input as long as its polarization direction is different from the polarization direction of the oscillation mode of the semiconductor laser to be injected.

While specific embodiments of the invention have been illustrated and described herein, it is realized that other modifications and changes will occur those skilled in the art. It is therefore to be understood that the appended claims are intended to cover all modifications and changes as fall within the true spirit and scope of the invention.

We claim:

1. An optical logic circuit comprising:
   a semiconductor laser having an optical resonator and emitting laser light;
   a first means disposed in front of one output surface of said semiconductor laser for separating polarization components;
   a current source coupled to said semiconductor laser;
   a light source disposed in front of another output surface of said semiconductor laser for injecting a light signal into said semiconductor laser;
   a second means disposed between said semiconductor laser and said light source for rotating a polarization plane of said light signal;
   a third means disposed between second means and said semiconductor laser for selectively passing only a specific polarization component of said light signal.

2. An optical logic circuit of claim 1, wherein said light source is controlled by light injected from another light source.

3. An optical logical circuit of claim 1, wherein at a semiconductor laser side of said second means and at a front side of an end surface of said light source, polarizers are disposed, respectively.

4. An optical logic circuit of claim 1, wherein an electric potential vector of said specific polarization component is out of parallel with a major surface of an active layer of said semiconductor laser.

5. An optical logic circuit of claim 1, wherein an electric potential vector of said specific polarization component is out of perpendicular to a major surface of an active layer of said semiconductor laser.

6. An optical logic circuit comprising:
   a first semiconductor laser having an optical resonator and emitting laser light;
   a second semiconductor laser disposed so as to be opposite to an output surface of said first semiconductor laser for supplying light signal to said first semiconductor laser;
   a first means disposed opposite to another output surface of said first semiconductor laser for separating polarization components;
   a light source coupled to said first semiconductor laser; and
   a second means for controlling light output of said second semiconductor laser;
   wherein said first semiconductor laser is slanted with respect to said second semiconductor laser around an axis passing through active layers of said first and second semiconductor laser as a rotation axis.

7. An optical logic circuit of claim 6, further comprising a third means disposed between said first and second semiconductor lasers for selectively passing only light transferring from said first semiconductor laser to said second semiconductor laser.

8. An optical logic circuit of claim 6, wherein said slanted angle is an angle other than 90°.

9. An optical logic circuit comprising:
   a semiconductor integrated circuit including a semiconductor substrate, a first semiconductor laser and a second semiconductor laser having an optical resonator and emitting laser light disposed on said semiconductor substrate; a waveguide optically coupled to one output surfaces of said first and second semiconductor lasers, and a means disposed at another output surface side of said second semiconductor laser for separating output light of said second semiconductor laser into polarization components;
   a power supply coupled to said second semiconductor laser; and
   a means for controlling light output of said first semiconductor laser.

10. An optical logic circuit of claim 9, further comprising a means disposed in said waveguide for rotating a polarization plane of light output from said first semiconductor laser.

11. An optical logic circuit of claim 9, wherein at least one of said first and second semiconductor lasers is slanted with respect to one major surface of said semiconductor substrate.

* * * * *